United States Patent
Kadetov et al.

(10) Patent No.: US 12,044,510 B2
(45) Date of Patent: Jul. 23, 2024

(54) PULSE GENERATOR FOR AN HPEM PULSE

(71) Applicant: Diehl Defence GmbH & Co. KG, Überlingen (DE)

(72) Inventors: Victor Kadetov, Röthenbach an der Pegnitz (DE); Diana Münzel, Simmelsdorf (DE)

(73) Assignee: Diehl Defence GmbH & Co. KG, Überlingen (DE)

( * ) Notice: Subject to any disclaimer, the term of this patent is extended or adjusted under 35 U.S.C. 154(b) by 0 days.

(21) Appl. No.: 17/902,072

(22) Filed: Sep. 2, 2022

(65) Prior Publication Data

US 2023/0066590 A1 Mar. 2, 2023

(30) Foreign Application Priority Data

Sep. 2, 2021 (DE) ..................... 10 2021 004 466.5

(51) Int. Cl.
*F41H 13/00* (2006.01)
*F41H 11/02* (2006.01)

(52) U.S. Cl.
CPC ......... *F41H 13/0043* (2013.01); *F41H 11/02* (2013.01)

(58) Field of Classification Search
CPC ...... F41H 13/0043; F41H 13/00; F41H 11/02; F41H 11/0093; H03B 11/02; H03K 3/537
See application file for complete search history.

(56) References Cited

U.S. PATENT DOCUMENTS

| | | | | |
|---|---|---|---|---|
| 2,924,714 | A * | 2/1960 | Davis | H01T 1/00 313/313 |
| 4,741,405 | A * | 5/1988 | Moeny | E21B 7/007 175/16 |
| 7,498,697 | B2 * | 3/2009 | Hofmann | H03K 3/537 307/106 |

(Continued)

FOREIGN PATENT DOCUMENTS

| | | |
|---|---|---|
| DE | 10213804 B4 | 9/2012 |
| DE | 102015008296 B4 | 8/2017 |

OTHER PUBLICATIONS

Cho Young-Maan et al.: "Integrated Circuit Model for Generation and Propagation of High Power Electromagnetic Pulse", Journal of the Korean Physical Society, vol. 72, No. 4, Feb. 2018 pp. 492-498, XP036442861, ISSN: 0374-4884, DOI: 10.3938/JKPS.72.492 [retrieved on Oct. 18, 2017].

(Continued)

*Primary Examiner* — Arman B Fallahkhair
(74) *Attorney, Agent, or Firm* — Laurence A. Greenberg; Werner H. Stemer; Ralph E. Locher

(57) ABSTRACT

A pulse generator for generating an HPEM pulse includes a Marx generator having a plurality of capacitors that are connected in series between two output poles, providing a Marx voltage between the output poles during operation of the Marx generator. A DS resonator has two input poles and each of the input poles is connected to a respective one of the output poles by a respective supply line. The capacitors are physically disposed along a profile line having two ends at each of which a respective one of the output poles is located. A distance between the output poles is smaller than a longitudinal extent of the Marx generator along the profile line.

12 Claims, 5 Drawing Sheets

(56) References Cited

U.S. PATENT DOCUMENTS

| | | | | |
|---|---|---|---|---|
| 7,795,758 B2* | 9/2010 | Staines | | F41H 13/0068 |
| | | | | 307/108 |
| 8,212,417 B2* | 7/2012 | Urban | | H03B 11/02 |
| | | | | 307/106 |
| 8,358,176 B2* | 1/2013 | Stark | | F41H 13/0093 |
| | | | | 333/13 |
| 9,300,280 B2* | 3/2016 | Camp | | H03K 3/53 |
| 9,683,817 B1* | 6/2017 | Camp | | H03K 3/537 |
| 10,396,764 B2* | 8/2019 | Lassalle | | H03K 3/53 |
| 10,945,329 B2* | 3/2021 | Miller | | H02M 7/106 |
| 2006/0198485 A1* | 9/2006 | Binderbauer | | G21B 1/052 |
| | | | | 376/121 |

OTHER PUBLICATIONS

Lee J M et al.: "Design of a damped sinusoidal oscillator system", Pulsed Power Conference (PPC), 2011 IEEE, Jun. 19, 2011 (Jun. 19, 2011), pp. 414-419, XP032172844, DOI: 10.1109/PPC.2011.6191456 ISBN: 978-1-4577-0629-5.

* cited by examiner

PULSE GENERATOR FOR AN HPEM PULSE

CROSS-REFERENCE TO RELATED APPLICATION

This application claims the priority, under 35 U.S.C. § 119, of German Patent Application DE 10 2021 004 466.5, filed Sep. 2, 2021; the prior application is herewith incorporated by reference in its entirety.

FIELD AND BACKGROUND OF THE INVENTION

The invention relates to the generation of HPEM (high-power electromagnetic) pulses by way of appropriate pulse generators.

German Patent DE 10 2015 008 296 B4 discloses a defense drone for defending small drones. The defense drone for defending a small drone includes an HPEM device secured to the body for generating a high-power electromagnetic pulse. An HPEM device includes a current source with a downstream voltage converter, a Marx generator and a resonator. The current source may be a rechargeable battery or a battery, for example. The voltage converter generates a high voltage, with a switch being provided between the current source and the voltage converter. The Marx generator is a pulse generator that is operated with DC voltage. The resonator is, for example, a DS resonator (damped-sinusoid resonator) that generates a damped sine wave.

SUMMARY OF THE INVENTION

It is accordingly an object of the invention to provide a pulse generator for an HPEM pulse, which overcomes the disadvantages of the heretofore-known devices of this general type and which improves the generation of HPEM pulses.

With the foregoing and other objects in view there is provided, in accordance with the invention, a pulse generator for generating an HPEM pulse, including:
  a Marx generator having a plurality of capacitors that are connected in series between two output poles, wherein a Marx voltage is provided between the output poles during operation of the Marx generator,
  a DS resonator having two input poles, wherein each of the input poles is connected to one of the output poles by a respective supply line,
  the capacitors being spatially disposed along a profile line at the two ends of which a respective one of the output poles is located, and
  the distance between the output poles being smaller than the longitudinal extent of the Marx generator along the profile line.

Preferred or advantageous embodiments of the invention and of other invention categories become apparent from the further claims, from the following description and from the appended figures.

The present case thus considers only the pulse generator of an HPEM device, as is known from the aforementioned prior art, for example. The pulse generator is formed of that section of the HPEM device that extends from the Marx generator to the DS resonator. Both of those are connected by supply lines in order to transfer the Marx voltage generated by the Marx generator to the DS resonator. The present case does not consider other components of an HPEM device, such as a current source connected upstream of the Marx generator for supplying the energy for the HPEM pulses or an antenna assembly connected downstream of the DS resonator for emitting the HPEM pulses, for example.

The pulse generator, also referred to as the HPEM source, is used to generate an HPEM pulse, in particular in the form of a voltage pulse. The pulse generator contains a Marx generator. The Marx generator contains a plurality of capacitors that together are also referred to as a capacitor bank. The capacitors are connected in series between two output poles of the Marx generator. The Marx generator is configured as is conventional in the art in terms of the electrical structure thereof. In addition to the output, the Marx generator thus contains, in particular, an input for connection to an energy supply, two charging lines for connecting the respective capacitor poles, charging resistors/inductors in the charging lines, spark gaps for discharging the capacitor bank, etc. However, none of those components are considered in any more detail herein.

An output voltage is provided between the output poles during operation of the Marx generator, in particular when it is ignited/discharged. The output voltage is also referred to as Marx voltage. In particular, the first output pole is an earth pole and the second output pole is a high-voltage pole to which the Marx voltage to earth is applied as high-voltage potential during operation.

The pulse generator furthermore contains a DS (damped sinusoidal) resonator. The resonator has two input poles. The input poles are used during operation to receive the output voltage or Marx voltage of the Marx generator. Upon ignition of the pulse generator or Marx generator, the Marx voltage (transmitted over the supply lines, see below) is thus received there.

Each of the input poles is connected to one of the output poles by a respective supply line for this purpose. The supply lines have an inherent inductance. The input voltage at the DS resonator is not necessarily equal to the output voltage at the output poles due to the transient processes in the pulse generator. Instead, a C-L-C arrangement (C: capacitive Marx generator—L: inductive supply line—C: capacitive DS resonator) is produced, which "pumps" the energy from the Marx generator/Marx voltage to the DS resonator and transmits it in the input voltage thereof.

Capacitors as concrete components are disposed along a profile line in space, that is to say physically or concretely. A respective one of the output poles is located at each of the two ends of the profile line. The "ends" are to be understood broadly in this case as a respective "end position" of the profile line. For example, it may also mean in this case that the output poles are located at the ends of the profile line at any location of a transverse plane to the profile line.

The distance between the output poles is smaller than the longitudinal extent of the Marx generator along the profile line. The "distance" is the shortest route or straight line between the two output poles. The longitudinal extent is the length of the profile line along the profile thereof, which may take any shape.

The profile line is, in particular, the line that connects the geometric center points of the capacitors to one another in the order in which they are electrically connected in series. This may be a string of straight sections but also a curve, for example a spline curve through the center points. However, the profile line may also run through the respective positive or negative contacts of the capacitors, for example. In particular, the profile line is the line that describes one of the two electrical charging lines (one connects the "positive" poles, the other connects the "negative" poles of the capacitors), that is to say an electrical connection between the capacitors at positive and negative contacts that electrically connects the capacitors in parallel.

The profile line thus describes the spatial, actually concrete, physical structure of the Marx generator or the spatial arrangement of the capacitors and relates not only to the electrical property of a series circuit thereof. According to the invention, the actual spatial arrangement deviates from a straight, linear arrangement, so is "not straight."

The profile line is thus not straight, in particular runs in a curved, bent, nested, curvy, convoluted, etc. manner depending on the spatial arrangement of the capacitors of the Marx generator that deviates from a purely linear spatial arrangement.

The capacitors are, in particular, all structurally identical and/or have the same dimensions/the same connection geometry, etc. In this respect, the Marx generator thus has a regular structure of a multiplicity of identical or repeating stages/capacitors/capacitor sections, etc. (including circuitry: resistors/inductors/spark gaps, etc.).

The invention is based on the fundamental concept—in particular for the application of HPEM with respect to drones—of achieving an increase in the range of a conventional system by a factor of at least 1.5 without scaling the antennae. One conceivable option in this respect would be to feed the DS resonator (with the Marx voltage) by way of a "linear" Marx generator with a higher voltage that is conventional in the art. The increase in range would thus be achieved through the use of a more powerful (higher Marx voltage) Marx generator and a correspondingly scaled antenna. However, the configuration of the Marx generator and the correspondingly scaled antenna may be subject to both physical and structural limits in the desired scaling in such a way that that option is not practicable. That is because Marx generators are longer at a higher voltage since they require further capacitor stages. However, as a result, the supply lines leading from the respective ends (output poles) to the DS resonator are also longer, with the result that the inductances thereof increase. The maximum possible charging current thus consequently decreases at the same time in the event of such scaling.

According to the invention, there is a deviation from the spatially straight arrangement of the capacitors, as a result of which the ends (output poles) of the series arrangement can be brought spatially closer to one another. The supply lines required from the ends (output poles) to the DS resonator are shorter as a result. This also makes it possible, in particular, to install the resonator together with the Marx generator in a housing that, in particular, is smaller (greatest extent) compared to the linear arrangement. In any case, the cable connection (supply lines) between the Marx generator and the DS resonator can be reduced in comparison to a linear arrangement, in particular can be reduced to a minimum. An absolute maximum charging current from the Marx generator to the DS resonator is thus achieved. In order to be able to implement this, the Marx capacitor bank is spatially curved, bent, etc. in an unconventional manner, in particular grouped around the resonator (in particular in an approximate ring shape around it or in an S shape next to it—see below).

The aforementioned option of an increased number of stages in the Marx generator is compensated for according to the invention by way of improved overshooting of the voltage in the C-L-C resonator charging circuit (generator), or an equally high effective charging voltage is achieved at the DS resonator. This overshooting therefore stems from the fact that the spark gaps require a certain amount of time to fully connect through. In this time, the Marx voltage can increase further without being discharged in the DS resonator. The reduced inductance of the supply lines causes the Marx voltage to increase more rapidly and it becomes higher before the breakdown has fully occurred.

According to the invention, there is a power increase in the DS resonator due to an overvoltage being reached more quickly (overshoot of the Marx voltage when the Marx voltage increases more rapidly above the actual resonator breakdown voltage since the spark gap requires a certain amount of time to ignite or fully conduct; in this time, the Marx voltage may be further "inflated").

An increased level of (personal) safety results for the event that all (high) voltage-carrying parts can be disposed in a single cohesive space (interior of a housing) with insulation gas—see below.

In this case, corona discharges and as a result possible chemical cleavage products are prevented when the voltage-carrying parts run fully in the insulation gas and do not come into contact with air.

A joint housing in which the Marx generator (at least the high-voltage-carrying parts, in particular output poles) and the DS resonator (at least also the high-voltage-carrying parts thereof)—and in particular the supply lines—are accommodated can be used as EMC (EMC: electromagnetic compatibility) protection when made of metal.

The pulse generator therefore has a lower space requirement overall than when configured with a "linear" Marx generator—at least with respect to the greatest required extent thereof.

The resonator charging circuit (components that are used to supply a high voltage to the DS resonator), in particular the Marx generator in the non-straight spatial form, enables a low, in particular selectable up to a minimum length, in particular minimum, inductance (of the supply lines) between the Marx generator and the DS resonator. As a result, the charging voltage (Marx voltage) of the resonator increases before it (short-circuits) ignites; the aforementioned voltage inflation/overshoot/overvoltage. The field generation of the resonator is increased in a measurable manner.

The invention differs from a conventional resonator feed, which is carried out by using a "linear" Marx generator. The term "linear" is to be understood as meaning that the stages/capacitors of the conventional Marx generator are disposed spatially/concretely in a straight line in succession in series. The charging current of the DS resonator can be maximized by deviating from that straight configuration. It is thus possible to increase the range of a DS effector system containing the pulse generator without scaling reflectors and antennae.

The present case thus proposes a non-straight, in particular ring-shaped, Marx construction (spatial arrangement of the capacitors) for a DS resonator that achieves an increased overvoltage at the DS resonator.

In one preferred embodiment, the profile line lies in a plane. In other words, all of the capacitors are disposed in a common plane. It is thus particularly easily possible to produce Marx generators that can be connected in series.

In one preferred embodiment, the profile line follows a ring shape. In this case, "follow" is to be understood as meaning that the profile line represents only a section of a ring shape but is not fully closed annularly, with the result that a distance remains between the ends of the profile line and thus between the output poles. The distance is dimensioned to be wide enough to prevent a flashover between the output poles at the intended maximum Marx voltage. In particular, the profile line follows the ring shape for at least 95%, at least 90%, at least 85%, at least 80% or at least 75% of the length of the ring shape (for example the circumference of a circle). A profile line that runs in a ring shape and a corresponding capacitor arrangement permit the arrangement of the output poles close to one another in order to thus enable short supply lines to the DS resonator. The profile line is then in particular a round shape, bend shape, in particular a circular-segment shape.

In an alternative embodiment, the profile line follows an at least single S shape. The "at least single" S shape is to be understood as meaning that other curves may also adjoin this basic S shape (that has two curves), the basic S shape ultimately representing a serpentine shape with 2 (single S shape), 3 or more bends, wherein 3 or more bends are then intended to be understood in this case as a "multiple S shape". The statements relating to the ring shape above apply in this case accordingly. In this case, however, a tighter packing of the capacitors together is possible than in the case of a ring shape since the interior of the "ring" can also be filled with capacitors.

In a preferred variant of the embodiments mentioned above, the profile line is a zigzag line that runs along a ring shape or the S shape. The ring shape and the S shape may be the same shapes as above. In this case, "run along . . . " means: the zigzag thus extends in each case alternately along a ring-shaped/S-shaped central line. In this case, the zigzag line is to be understood in the conventional sense, namely as a string of pieces of a straight line adjoining one another alternately at acute angles. In particular, the straight-line pieces are of equal length. In other words, the profile line is produced as follows: a zigzag line is first produced along a straight line of extent. With this zigzag line, in particular all of the straight-line pieces are of equal length and all of the angles between the respective straight-line pieces are equal. This straight line of extent is then bent to form the ring shape or S shape, with the zigzag line accordingly also being bent or deformed but retaining its zigzag structure. The respective straight-line sections of the zigzag line also remain in the bent or deformed shape; only the angles change.

A spatially particularly densely packed capacitor arrangement can thus be provided.

In a preferred embodiment, the profile line runs at least in part around the DS resonator. In particular, the profile line in this case is the ring shape or a "ring-shaped"—that is to say bent in a ring shape as explained above—zigzag line. In particular, the DS resonator is located centrally within the ring shape. The ring shape is, in particular, a circular shape located concentrically with respect to the DS resonator. A particularly tightly packed pulse generator with a substantially symmetrical arrangement is thus produced.

In an alternative embodiment, the profile line runs alongside the DS resonator, wherein the profile line adjoins the DS resonator by way of the ends of the profile line. The output poles located—as explained above—at the ends of the profile line therefore also adjoin the DS resonator. In particular, there are thus no sections of the profile line located between the ends thereof and the DS resonator. As a result, particularly short supply lines from the output poles to the DS resonator or the input poles thereof can thus be realized. In this case, the profile line is, in particular, the aforementioned S shape. In particular, the DS resonator is disposed alongside the capacitor bank that follows the aforementioned S shape.

In a preferred embodiment, the DS resonator extends in terms of its shape (spatial shape, in particular basic shape, outer shape, approximate shape, configuration, etc.) along a longitudinal axis and the capacitors extend between the two respective positive and negative contacts thereof in parallel with the longitudinal axis. This means that the connecting line between the positive and negative contact runs in parallel with the longitudinal axis.

In this case, with respect to the DS resonator, in particular the basic shape of the housing is discussed, which, in particular, is a straight circular cylindrical shape. With respect to the capacitors, in particular the extent thereof from one pole to the other ("+" and "−" pole) is discussed. However, the capacitors can also be discussed in terms of their outer shape, which may also be a straight circular cylindrical shape. In this embodiment, an overall spatially particularly tightly packed pulse generator can be provided.

In a preferred embodiment, the Marx generator at least with respect to the output poles thereof and the DS resonator at least with respect to the input poles thereof and all of the supply lines are accommodated within the joint housing (in the interior thereof). The housing is, in particular, closed, that is to say does not have any gaps (except for feedthroughs, etc. for lines etc.). The pulse generator thus has a corresponding housing. In particular, the entire resonator, and not only the input poles thereof, and/or also the entire Marx generator or the capacitors thereof, not only the output poles thereof, is/are accommodated within the housing. At least all of the high-voltage-carrying parts or else all of the components of the pulse generator are thus housed and thus accommodated so as to be protected. This also means that people located outside (outside of the housing) are protected by the housing from the components in the interior of the housing or the entire pulse generator.

In a preferred variant of this embodiment, the Marx generator is accommodated fully within the housing. However, only a section of the DS resonator that includes the inputs is accommodated within the housing. A remaining section of the DS resonator is located outside of the housing. The housing can thus be kept as small as possible without losing the aforementioned protective aspects.

In a preferred variant of these embodiments, the housing is an electrically conductive, in particular metal, housing. As a result, the housing can be used, inter alia, as EMC protection for the components within the housing.

In a preferred variant of the aforementioned embodiments, the housing is filled with an insulation gas. An electrical breakdown between components with different voltage potentials is made more difficult by this; in particular, spark gaps for the same breakdown voltage can be dimensioned to be smaller, as a result of which the installation size of the entire pulse generator can be reduced.

Other features which are considered as characteristic for the invention are set forth in the appended claims.

Although the invention is illustrated and described herein as embodied in a pulse generator for an HPEM pulse, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
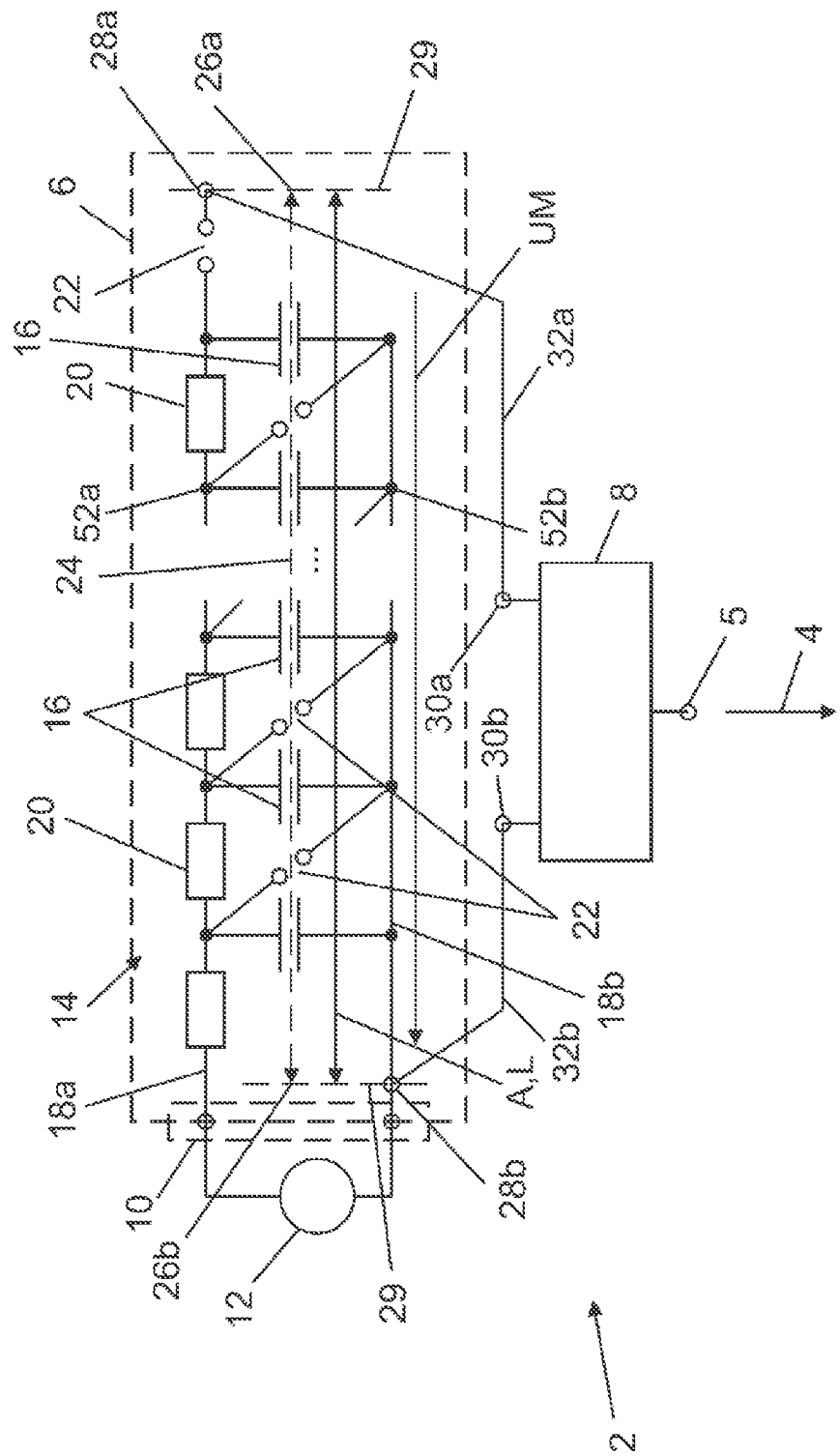
FIG. 1 is a diagram showing a basic illustration of a pulse generator having a Marx generator according to the prior art.

Referring now to the figures of the drawings in detail and first, particularly, to FIG. 1 thereof, there is seen a pulse generator 2 for generating an HPEM pulse 4 or a voltage pulse/energy pulse required therefor, which is indicated therein symbolically as an arrow. The pulse generator 2 is supplied with a charging voltage 12 at an input 10 (not explained in any more detail) of a Marx generator 6 and of the pulse generator 2. The HPEM pulse 4 is generated at an output 5 and fed to an antenna arrangement (not illustrated herein) in order to be emitted thereby in a targeted manner. The emission is used, for example, to combat drones (not illustrated) by using HPEM.

The pulse generator 2 contains the Marx generator 6 and a DS resonator 8. The Marx generator 6 has the input 10 in a manner conventional in the art and is supplied thereby. The Marx generator 6 contains a capacitor bank 14 having a plurality of capacitors 16, of which only five are illustrated by way of example in FIG. 1. The capacitors 16 are connected in series in a manner conventional in the art and to this end are connected between two charging lines 18a, 18b that are supplied with the charging voltage 12. In a manner conventional in the art, the Marx generator 6 contains charging resistors 20 in the charging lines 18a and spark gaps 22—both between the individual capacitor 16 and on the output side—that are not intended to be explained any further herein.

The capacitors 16 are disposed along a profile line 24 in spatial or concrete terms. The profile line 24 has two ends 26a, 26b. Two output poles 28a, 28b of the Marx generator 6 are disposed at these ends 26a, 26b of the profile line 24. The arrangement "at the end" in this case means that the output poles are located in a respective transverse plane 29 (perpendicular to the plane of the paper) to the profile line 24 at the location of the respective end 26a, 26b.

In this spatial or concrete respect, the Marx generator 6 in FIG. 1 is configured according to the prior art: The profile line 24 is a straight line in this case. Such a spatial arrangement of the capacitors 16 is conventional in the prior art.

During operation of the Marx generator 6 (after the capacitor bank 14 has been charged and during or after breakdown of the spark gaps 22), an output voltage of the Marx generator 6, namely the Marx voltage UM, is provided between the output poles 28a, 28b.

The DS resonator 8 has two input poles 30a, 30b that are supplied with the Marx voltage UM during operation. Therefore, the input poles 30a, 30b are connected to the output poles 28a, 28b by a respective supply line 32a, 32b. During operation, the DS resonator 8 generates the HPEM pulse 4 at the output 5 thereof—which also illustrates the output 5 of the pulse generator 2—based on the supply by the Marx voltage UM. According to the known spatial linear arrangement of the capacitors 16 or since the profile line 24 is a straight line, a distance A between the output poles 28a, 28b in this case corresponds to the length of the profile line 24 that corresponds to the longitudinal extent L of the Marx generator 6 along the profile line 24.

Figure 2:
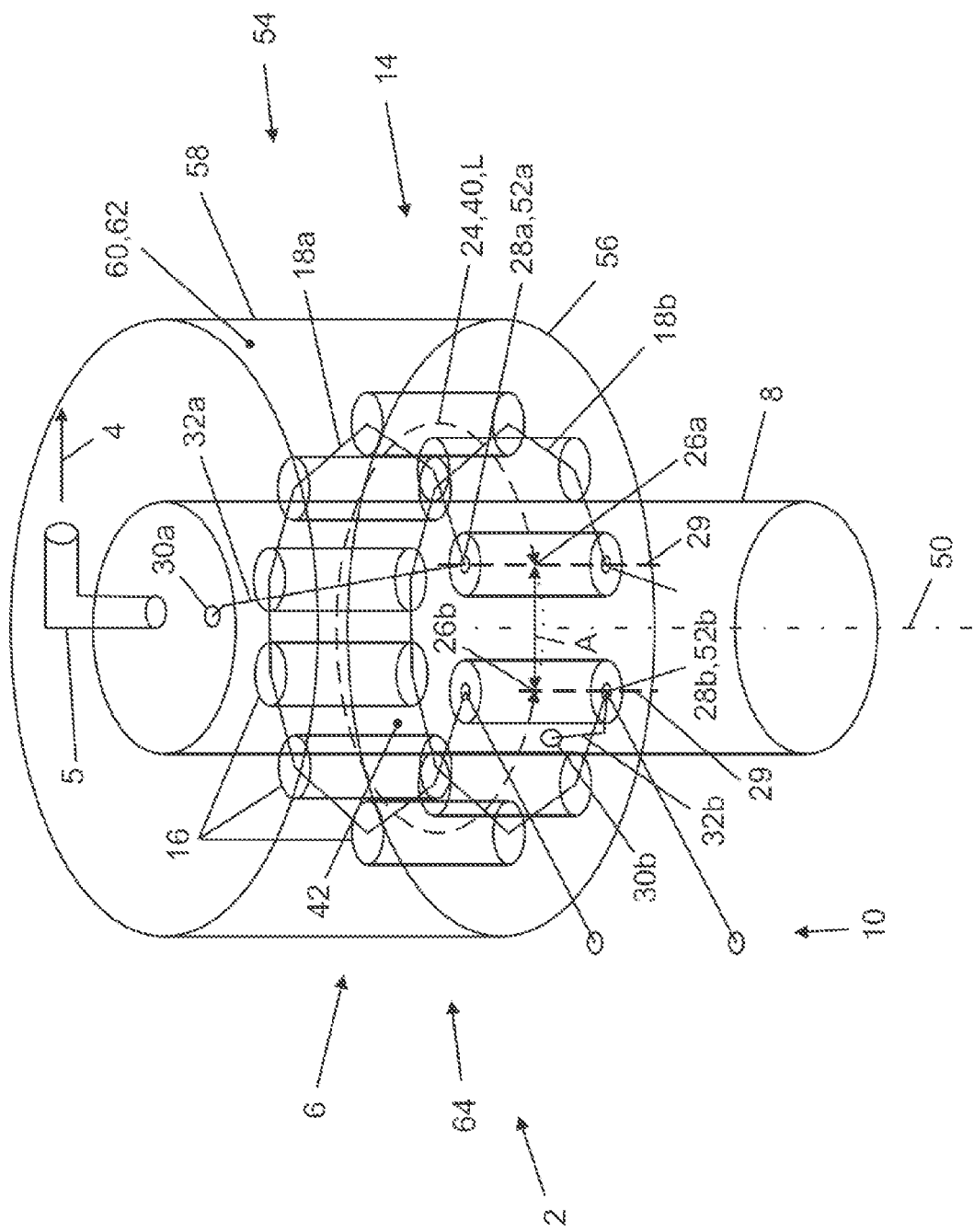
FIG. 2 is a perspective view of a generator according to the invention having a capacitor bank disposed in a ring shape around a DS resonator.

FIG. 2 shows a perspective view of a pulse generator 2 according to the invention.

Figure 3:
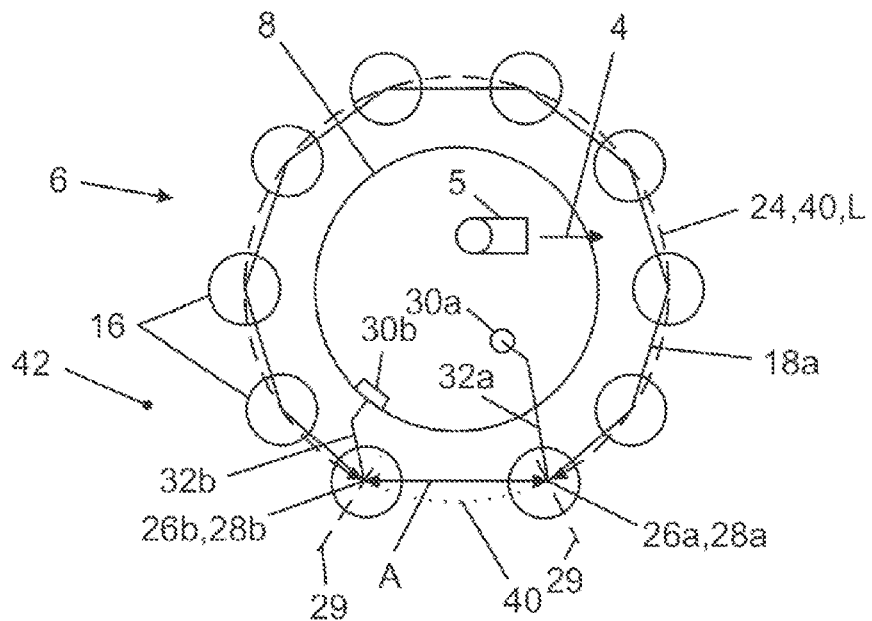
FIG. 3 is a plan view of the pulse generator from FIG. 2.

FIG. 3 shows a plan view of the pulse generator 2 from FIG. 2 in the direction of the arrow III.

Figure 4:
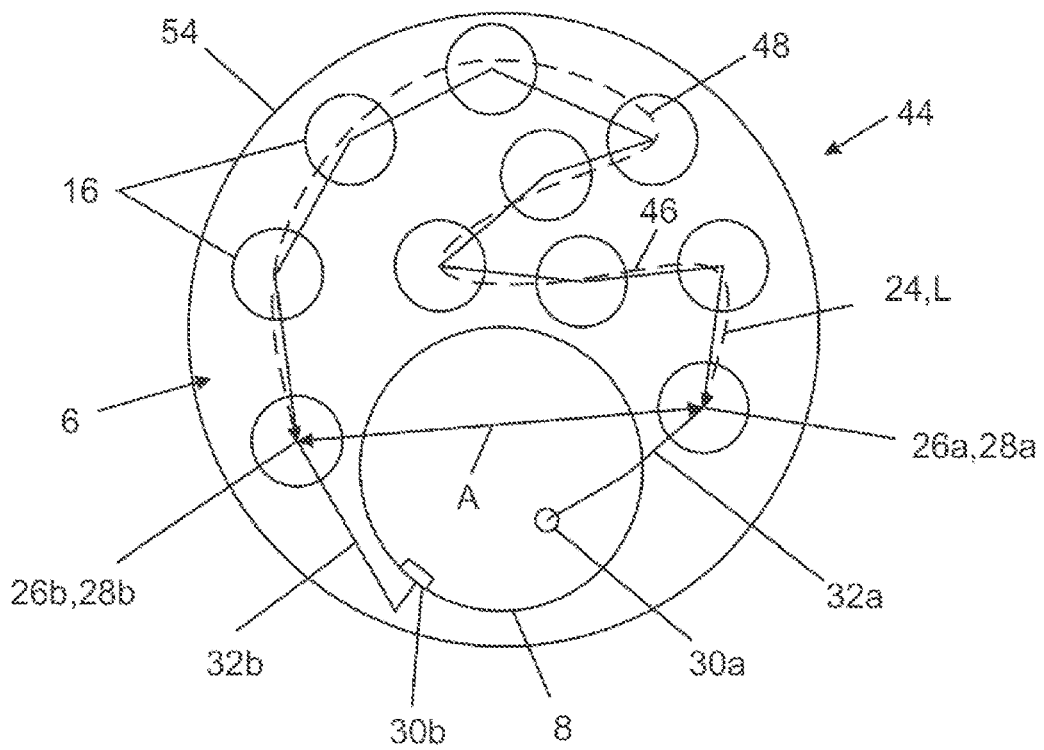
FIG. 4 is a plan view according to FIG. 3 of an alternative pulse generator having a capacitor bank disposed in a multiple S shape.

The electrical configuration and circuitry of the pulse generator 2 from FIGS. 3 and 4 corresponds to that from FIG. 1. According to the invention, however, the profile line 24 is not a straight line but follows a ring shape 40, which in this case is a circular shape (dotted continuation or extension of the dashed profile line). The term "follow the ring shape 40" is to be understood in this case as meaning that the profile line 24 does not form a complete closed ring, in this case a circle, but instead forms only a ring/circular segment, in such a way that a distance A remains between the ends 26a, 26b or transverse planes 29 of the profile line 24 and thus between the output poles 28a, 28b of the Marx generator 6.

Due to the ring-shaped arrangement of the capacitor bank 14, the ends 26a, 26b and thus the output poles 28a, 28b move closer together than in the case of a straight arrangement according to FIG. 1. The distance A between the output poles 28a, 28b is now therefore smaller than the longitudinal extent L of the Marx generator 6 along the profile line 24, that is to say the length (in this case again symbolized by a double arrow) of the profile line 24 along the ring shape 40 or circular shape.

The profile line 24 in this case lies in a plane 42 that corresponds to the plane of the paper in FIG. 3. In this case, the profile line 24 also runs around the DS resonator 8 (up to the "gap" that corresponds to the distance A).

The DS resonator 8 extends in terms of its spatial shape along a longitudinal axis 50. The respective capacitors 16, which in this case are all of the same shape, likewise extend in terms of their spatial shape between their respective positive contacts 52a and negative contacts 52b in parallel with the longitudinal axis 50. The ring shape 40 runs concentrically to the longitudinal axis 50; the plane 42 is a transverse plane of the longitudinal axis 50. The capacitor bank 14 is thus disposed concentrically with respect to the DS resonator 8.

The pulse generator 2 has a housing 54. The housing, in this case, contains a housing base 56, which is circular in this case, and a cover 58, which is cylindrical, in this case. Overall, the housing 54 encloses an interior 60, which in this case is filled with an insulation gas 62. In this case, the housing 54 is made from a metallic, electrically conductive material.

In the present case, the entire Marx generator 6 and therefore also the output poles 28a, 28b thereof are disposed inside the housing 54, that is to say in the interior 60 and thus in the insulation gas 62. The DS resonator 8 is disposed in the interior 60 at least to such an extent that the input poles 30a, 30b thereof are in the insulation gas 62, namely by way of a section 64 of the resonator that has the input poles 30a, 30b. The supply lines 32a, 32b run fully in the interior 60 and thus in the insulation gas 62. All of the components of the pulse generator 2 that thus carry the Marx voltage UM during operation are inside the insulation gas 62 and also inside the housing 54. An ionization of air and an undesired flashover between these components is therefore suppressed by the insulation gas 62 or the risk thereof is minimized.

The metallic housing 54 also serves to protect people who handle the pulse generator 2 and to provide an electromagnetic shield between the interior 60 and the exterior that surrounds the housing 54.

FIG. 4 shows a plan view according to FIG. 3 of an alternative pulse generator 2 or Marx generator 6 according to the invention. In contrast to the above, in this case the profile line 24 does not have a ring or circle shape but instead a "multiple," in this case double, S shape 44, which means that another bend 48—again curved in the opposite direction—adjoins a single S shape 46. In this case, too, the distance A between the ends 26a, 26b is again smaller than the longitudinal extent L of the Marx generator 6 along the profile line 24 (likewise between the ends 26a, 26b thereof).

Figure 5:
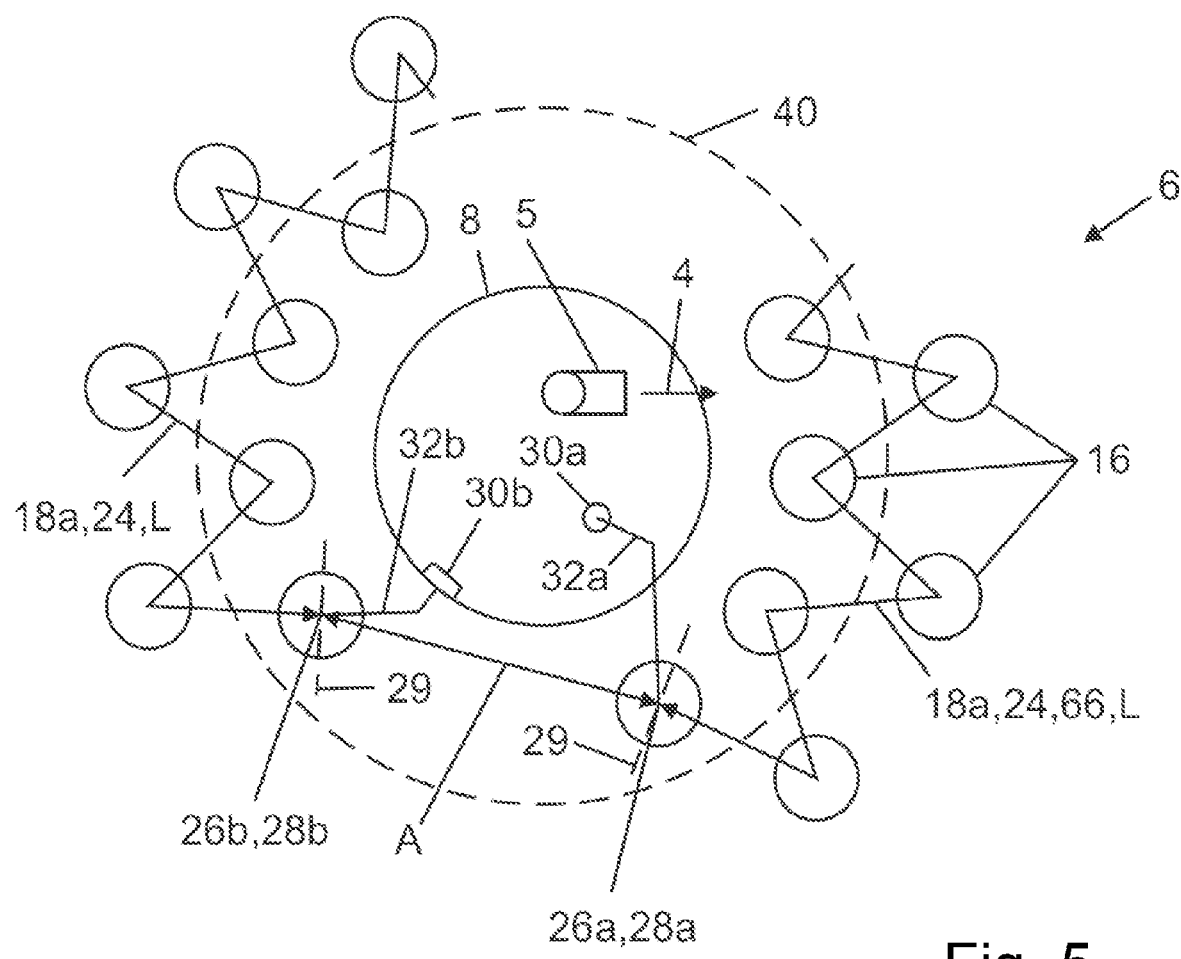
FIG. 5 is a plan view according to FIG. 3 of an alternative pulse generator having a capacitor bank disposed in a zigzag.

FIG. 5 shows a plan view according to FIG. 3 of another alternative pulse generator 2 or Marx generator 6 according to the invention. Some of the capacitors 16 of the capacitor bank 14 are not illustrated for the sake of clarity. In contrast to the above, in this case, although there is again a ring or circle shape indicated by using dashes, the profile line 24 is in this case a zigzag line 66 that follows the ring or circle shape, that is to say is bent towards the circle shape proceeding from a zigzag line (not illustrated) that runs in a straight line. In this case, too, the distance A between the ends 26a, 26b is again smaller than the longitudinal extent L of the Marx generator 6 along the profile line 24 (likewise between the ends 26a, 26b thereof).

In FIGS. 4 and 5, the profile line 24 runs in each case alongside the DS resonator; however, it adjoins the DS resonator 8 by way of the respective ends 26a, 26b thereof.

Figure 6:
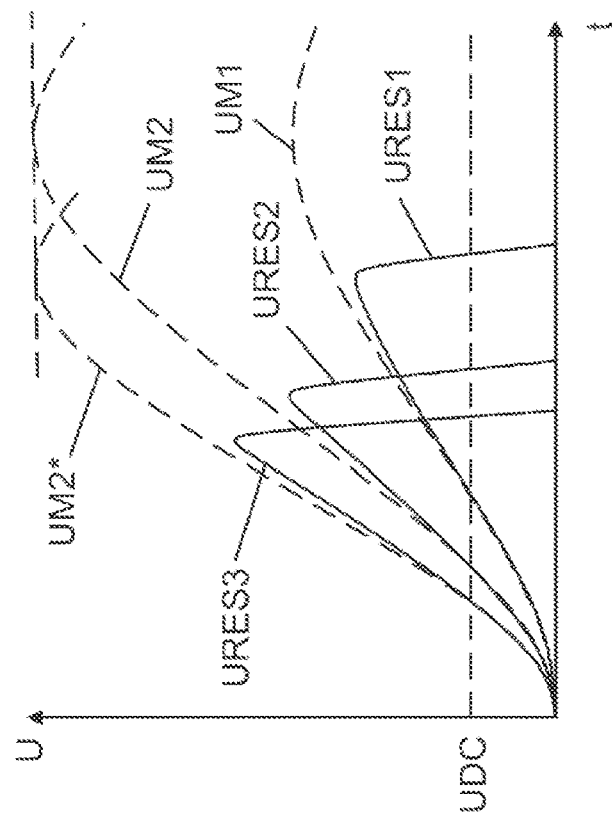
FIG. 6 is a diagram showing a profile of Marx voltages and resonator charging voltages over time.

FIG. 6 qualitatively illustrates the input voltage URES that can generally be achieved in a DS resonator 8 or at the input poles 30a, 30b thereof and that is higher or lower depending on the level of the fundamental Marx voltage UM1, UM2 (Marx generators 6 with different powers). This is because, strictly speaking, the voltages between the input poles 30a, 30b and the output poles 28a, 28b differ due to the transient processes even when a single "Marx voltage" is generally discussed herein for the sake of simplicity.

The profile of two different Marx voltages UM1 and UM2 and the thus achievable input voltages at the DS resonator 8 over time t is shown.

The basis for this is the excessive increase beyond the quasistatically achievable input voltage UDC (breakdown of the spark gaps with a quasistatic voltage increase). In this case, use is made of the effect that the breakdown of the spark gaps 22 requires a certain amount of time in which the Marx voltage UM can increase further. The excessive increase mentioned is also known as a semi-empirical "voltage-time integrals law" by Kind from 1957.

The invention is now based on the knowledge that reducing the inductances of the supply lines 32a, 32b, even at a constant Marx voltage (for example UM2), can be used to achieve a high input voltage at the resonator URES3 compared to URES2, since the Marx voltage UM2* increases more rapidly but the spark gaps 22 still require a certain amount of time for breakdown.

Figure 7:
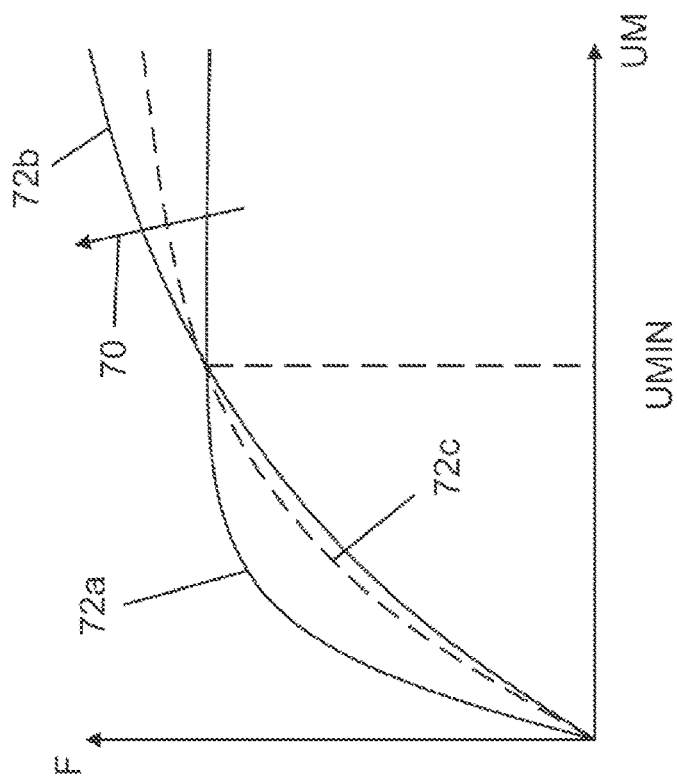
FIG. 7 is a diagram showing field amplitudes that can be achieved by using the HPEM pulse over the Marx voltage for various pulse generators or charging circuits.

FIG. 7 qualitatively illustrates this correlation again: The field amplitudes F of HPEM pulses 4 (after emission by an antenna) are shown. Each curve corresponds to another pulse generator 2, with these differing only by way of the inductances of their supply lines 32a, 32b. The inductances decrease in the direction of the arrow 70. The curves are plotted over the Marx voltage UM that is available. The curve 72a in this case corresponds to a Marx generator known from practice according to FIG. 1 with a profile line 24 in the form of a straight line, which is known as a CLC circuit (C: capacitor bank 14/L: supply lines 32a, 32b/C: DS resonator 6). The curve 72b corresponds to a pulse generator 2 with ideal supply lines 32a, 32b that have inductances of zero. This produces a C-C charging circuit that, however, does not have a resonance pump property between the two capacitances, such that only half the voltage is able to be generated with a particular charge of both capacitors (Marx generator 6 and DS resonator 8). The curve 72c corresponds to the invention; by decreasing the inductances of the supply lines 32a, 32b, a field amplitude that is higher in accordance with the invention can thus be achieved from a particular minimum Marx voltage, minimum voltage UMIN, although the Marx generator 6 does not have to be configured to have a higher achievable Marx voltage UM.

At moderate Marx voltages UM (less than UMIN), the C-L-C charging circuit is thus effective; the C-C charging circuit is not effective up to a factor of two. At higher resonator overvoltages (UM greater than UMIN), there is a greater efficiency of the pulse generator 2 according to the invention with a non-straight profile line 24, in particular a ring shape 40/S shape 44/zigzag line 66 compared to the Marx generator known from practice with a profile line 24 in the form of a straight line.

The following is a summary list of reference numerals and the corresponding structure used in the above description of the invention:

2 Pulse generator
4 HPEM pulse
5 Output (HPEM pulse)
6 Marx generator
8 DS resonator
10 Input
12 Charging voltage
14 Capacitor bank
16 Capacitor
18a,b Charging line
20 Charging resistor
22 Spark gap
24 Profile line
26a,b End
28a,b Output poles
29 Transverse plane
30a,b Input pole
32a,b Supply line
40 Ring shape
42 Plane
44 S shape (multiple)
46 S shape (single)
48 Bend
50 Longitudinal axis (DS resonator)
52a,b Positive/negative contact
54 Housing
56 Housing base
58 Cover
60 Interior space
62 Insulation gas
66 Zigzag line
64 Section (DS resonator)
70 Arrow
72a-c Curve
UM,UM1,2 Marx voltage
A Distance (output poles)
L Longitudinal extent (Marx generator)
URES1,2 Input voltage (DS resonator)
UDC Input voltage (quasistatic case)

UMIN Minimum voltage
t Time
F Field amplitude
U Voltage

The invention claimed is:

1. A pulse generator for generating an HPEM pulse, the pulse generator comprising:
 a pulse generator housing;
 a Marx generator having a plurality of capacitors connected in series between two output poles, providing a Marx voltage between said output poles during operation of said Marx generator, at least said output poles of said Marx generator being accommodated within said pulse generator housing;
 a DS resonator having two input poles, at least said input poles of said DS resonator being accommodated within said pulse generator housing;
 supply lines connecting each of said input poles to a respective one of said output poles, all of said supply lines being accommodated within said pulse generator housing;
 said capacitors being spatially disposed along a profile line having two ends, each of said output poles being located at a respective one of said ends of said profile line; and
 said output poles being spaced apart by a distance being smaller than a longitudinal extent of said Marx generator along said profile line.

2. The pulse generator according to claim 1, wherein said profile line follows a ring shape.

3. The pulse generator according to claim 2, wherein said profile line is a zigzag line running along said ring shape.

4. The pulse generator according to claim 1, wherein said profile line follows an at least single-S shape.

5. The pulse generator according to claim 4, wherein said profile line is a zigzag line running along said S shape.

6. The pulse generator according to claim 1, wherein said profile line lies in a plane.

7. The pulse generator according to claim 1, wherein said profile line runs at least in part around said DS resonator.

8. The pulse generator according to claim 1, wherein said profile line runs alongside said DS resonator, and said profile line adjoins said DS resonator by way of said ends of said profile line.

9. The pulse generator according to claim 1, wherein said DS resonator has a shape extending along a longitudinal axis, said capacitors have positive contacts and negative contacts, and said capacitors extend parallel to said longitudinal axis between said positive contacts and said negative contacts of each respective capacitor.

10. The pulse generator according to claim 1, wherein said Marx generator is accommodated fully within said pulse generator housing, but only a section of said DS resonator including said inputs is accommodated within said pulse generator housing.

11. The pulse generator according to claim 1, wherein said pulse generator housing is an electrically conductive housing.

12. The pulse generator according to claim 1, wherein said pulse generator housing is filled with an insulation gas.

* * * * *